United States Patent [19]
Smith

[11] Patent Number: 5,055,709
[45] Date of Patent: Oct. 8, 1991

[54] DCFL LATCH HAVING A SHARED LOAD

[75] Inventor: Robert T. Smith, Mesa, Ariz.

[73] Assignee: Motorola, Inc., Schaumburg, Ill.

[21] Appl. No.: 516,632

[22] Filed: Apr. 30, 1990

[51] Int. Cl.$^5$ .............................................. H03K 3/26
[52] U.S. Cl. ................................... 307/279; 307/212.1
[58] Field of Search ................... 307/279, 272.1, 272.2, 307/481, 448, 450

[56] References Cited

U.S. PATENT DOCUMENTS

| | | | |
|---|---|---|---|
| 4,629,911 | 12/1986 | Berbernes et al. | 307/279 |
| 4,843,264 | 6/1989 | Galbraith | 307/279 |
| 4,970,406 | 11/1990 | Fitzpatrick | 307/272.1 |
| 4,978,870 | 12/1990 | Chen et al. | 307/272.1 |
| 4,990,799 | 2/1991 | Weiss | 307/279 |

*Primary Examiner*—David Hudspeth
*Assistant Examiner*—Andrew Sanders
*Attorney, Agent, or Firm*—Bradley J. Botsch

[57] ABSTRACT

A DCFL latch circuit having minimum power and device count, comprising a first field-effect transistor having a drain, a gate coupled to a first input at which a data signal is supplied, and a source. A second field-effect transistor having a drain coupled to the source of the first field-effect transistor, a gate coupled to a second input at which a logic clock signal is supplied, and a source coupled to a first supply voltage terminal. A third field-effect transistor having a drain coupled to an output of the latch circuit, a gate coupled to the drain of the first field-effect transistor, and a source coupled to the first supply voltage terminal. A fourth field-effect transistor having a drain coupled to the drain of the first field-effect transistor, a gate coupled to the output, and a source. A fifth field-effect transistor having a drain coupled to the source of the fourth field-effect transistor, a gate coupled to a third input at which the inversion of the logic clock signal is supplied, and a source coupled to the first supply voltage terminal. A load circuit coupled to the drain of the third field-effect transistor for providing current thereto and a shared load circuit coupled to the drains of the first and fourth field-effect transistors for providing current to the first field-effect transistor when the clock signal is in a first logic state and for providing current to the fourth field-effect transistor when the clock signal is in a second logic state.

7 Claims, 1 Drawing Sheet

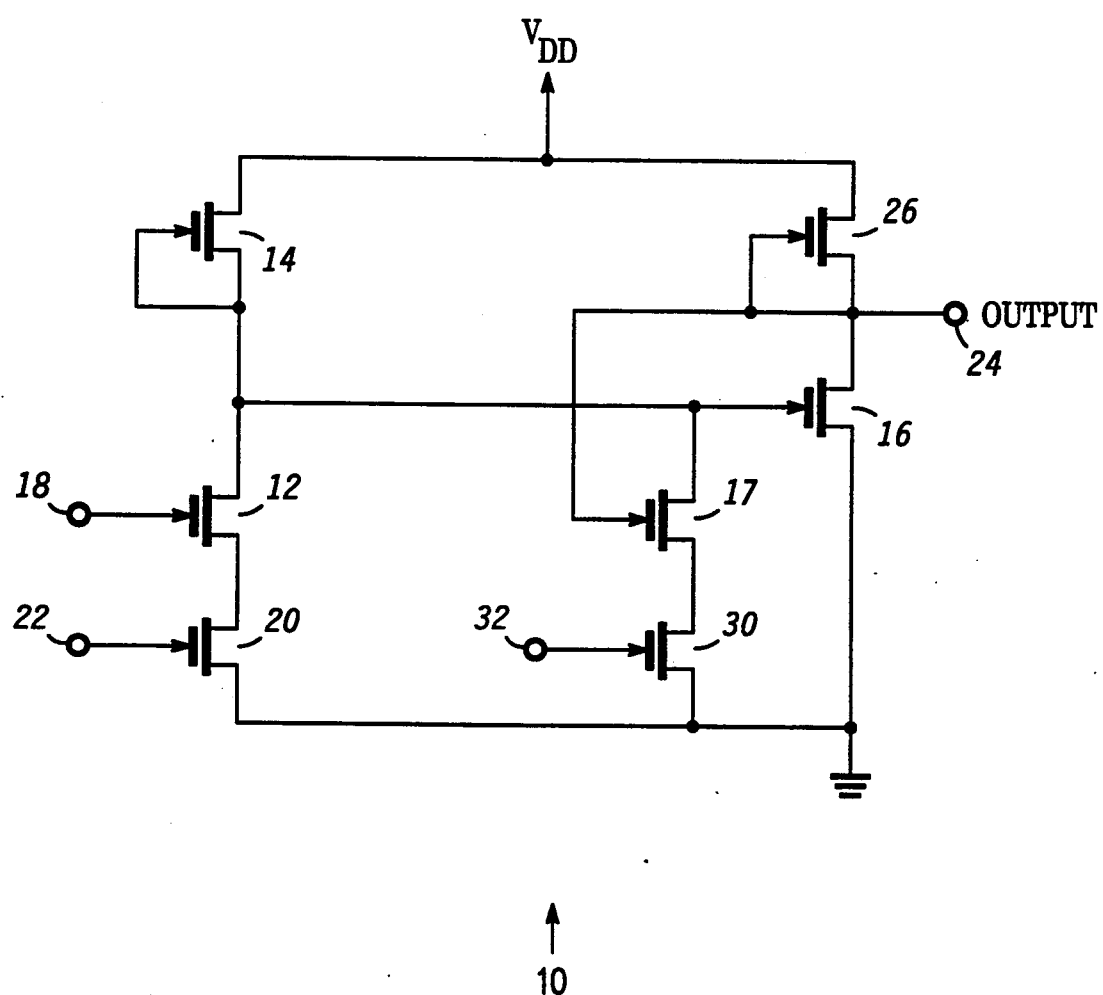

DCFL LATCH HAVING A SHARED LOAD

BACKGROUND OF THE INVENTION

This invention pertains to latch circuits and, in particular, direct-coupled FET logic (DCFL) latch circuits.

Latch circuits are utilized in numerous applications. A latch circuit typically consists of an acquire stage and a regeneration stage where data is clocked into the acquire stage when the clock is in a first logic state and then stored in the regeneration stage when the clock is in a second logic state, as is known. Most, if not all, DCFL technology has utilized two separate load devices: one for providing current to the acquire stage and another for providing current to the regeneration stage. Furthermore, since each load device typically draws a predetermined current, the power of most FET (field-effect transistor) circuits is directly proportional to the number of load devices used therein. Therefore, if a single load device could be shared between two different field-effect transistors (FET's), a substantial power reduction would result along with a decrease in device count.

Hence, a need exists for a DCFL latch circuit having minimum power and minimum device count.

SUMMARY OF THE INVENTION

According, it is an object of the present invention to provide an improved direct-coupled FET logic (DCFL) latch circuit.

Another object of the present invention is to provide an improved direct-coupled FET logic (DCFL) latch circuit sharing a load device which results in a decrease in power dissipation and device count.

In carrying out the above and other objects of the present invention, there is provided a direct-coupled field-effect transistor logic latch circuit, comprising a first field-effect transistor having a drain, a gate coupled to a first input at which a first input signal is supplied, and a source; a second field-effect transistor having a drain coupled to the source of the first field-effect transistor, a gate coupled to a second input at which a second input signal is supplied, and a source coupled to a first supply voltage terminal; a third field-effect transistor having a drain coupled to an output of the latch circuit, a gate coupled to the drain of the first field-effect transistor, and a source coupled to the first supply voltage terminal; a fourth field-effect transistor having a drain coupled to the drain of the first field-effect transistor, a gate coupled to the output, and a source; a fifth field-effect transistor having a drain coupled to the source of the fourth field-effect transistor, a gate coupled to a third input to which the inversion of the second input signal is supplied, and a source coupled to the first supply voltage terminal; a load circuit coupled to the drain of the third field-effect transistor for providing current thereto; and a shared load circuit coupled to the drains of the first and fourth field-effect transistors for providing current to the first field-effect transistor when the second signal is in a first logic state and for providing current to the fourth field-effect transistor when the second signal is in a second logic state.

The above and other objects, features and advantages of the present invention will be better understood from the following detailed description taken in conjunction with the accompanying drawing.

BRIEF DESCRIPTION OF THE DRAWING

The sole FIGURE is a detailed schematic diagram illustrating the preferred embodiment of the present invention.

DETAILED DESCRIPTION OF THE PREFERRED EMBODIMENT

Referring to the sole FIGURE, a detailed schematic diagram of latch circuit 10 of the present invention is shown comprising enhancement-mode field-effect transistor (FET) 12 having a drain coupled to the source and gate of depletion-mode FET 14, to the gate of enhancement-mode FET 16, and to the drain of enhancement-mode FET 17. The gate of enhancement-mode FET 12 is coupled to a first input terminal 18 while the source of enhancement-mode FET 12 is coupled to the drain of enhancement-mode FET 20. The drain of depletion-mode FET 14 is coupled to a first supply voltage terminal at which the operating potential $V_{DD}$ is applied. The gate of enhancement-mode FET 20 is coupled to a second input terminal 22 while the source of enhancement-mode FET 20 is returned to ground reference. The drain of enhancement-mode FET 16 is coupled to output terminal 24, to the source and gate of depletion-mode FET 26, and to the gate of enhancement-mode FET 17. The source of enhancement-mode FET 16 is returned to ground reference. The drain of depletion-mode FET 26 is coupled to operating potential $V_{DD}$. The source of enhancement-mode FET 17 is coupled to the drain of enhancement-mode FET 30, the latter having a gate coupled to a third input terminal 32 and a source returned to ground.

In operation, a data signal is typically applied at first input terminal 18 and a logic clock signal is typically applied at second input terminal 22 while the inversion of the clock signal applied at input terminal 22 is typically applied at third input terminal 32. When the clock signal is in a first logic state, a logic one for example, enhancement-mode FET 20 is rendered operative and enhancement-mode FET 30 is rendered non-operative. Since enhancement-mode FET 20 is rendered operative, the acquire stage of latch 10 comprising enhancement-mode FET's 12 and 20 is turned on by providing enhancement-mode FET 12 with a path to ground through enhancement-mode FET 20. This enables the data signal applied at the gate of enhancement-mode FET 12 to be acquired and then transferred to output terminal 24 via the two inverters comprised of enhancement-mode FET's 12 and 16, as is understood. Furthermore, depletion-mode FET 14 operates as the load device for enhancement-mode FET 12 when the clock signal is in the first logic state by providing current thereto.

On the other hand, when the clock signal is at a second logic state, a logic zero, enhancement-mode FET 30 is rendered operative and enhancement-mode FET 20 is rendered non-operative. Since enhancement-mode FET 30 is rendered operative, the regeneration stage of latch 10 comprising of enhancement-mode FET's 17 and 30 is turned on by providing enhancement-mode FET 17 with a path to ground through enhancement-mode FET 30. This enables the logic state presently occurring at output terminal 24 to be regenerated or stored at output terminal 24 via the two inverters comprised of enhancement-mode FET's 17 and 16, as is understood. It is important to realize that depletion-mode FET 14 now serves as a load device for enhancement-mode FET 17 when the clock signal is in a second logic state by providing current thereto. Therefore, depletion-mode FET 14 serves as a shared load device for both enhancement-mode FET's 12 and 17 thereby minimizing power and device count of latch 10. In addition, depletion-mode FET 26 is a load device for enhancement-mode FET 16 and, thus, provides current thereto.

It should be obvious to one of ordinary skill in the art that a plurality of enhancement-mode FET devices could be coupled across enhancement-mode FET 12, each with its own data input applied to its respective gate, to produce a NOR gate having a plurality of inputs. Therefore, if one or more of the plurality of inputs is at a logic high, then a logic high will occur at output terminal 24, as is understood by the operation of a NOR gate.

By now it should be appreciated that there has been provided a novel direct-coupled FET logic latch circuit that shares a load device which results in minimum power and device count.

What is claimed is:

1. A direct-coupled field-effect transistor logic latch circuit, comprising:
    a first field-effect transistor having a drain, a gate coupled to a first input at which a first input signal is supplied, and a source;
    a second field-effect transistor having a drain coupled to the source of said first field-effect transistor, a gate coupled to a second input at which a second input signal is supplied, and a source coupled to a first supply voltage terminal;
    a third field-effect transistor having a drain coupled to an output of the latch circuit, a gate coupled to said drain of said first field-effect transistor, and a source coupled to said first supply voltage terminal;
    a fourth field-effect transistor having a drain coupled to said drain of said first field-effect transistor, a gate coupled to said output, and a source;
    a fifth field-effect transistor having a drain coupled to said source of said fourth field-effect transistor, a gate coupled to a third input to which the inversion of said second input signal is supplied, and a source coupled to said first supply voltage terminal;
    load means coupled to said drain of said third field-effect transistor for providing current thereto; and
    shared load means coupled to said drains of said first and fourth field-effect transistors for providing current to said first field-effect transistor when said second signal is in a first logic state and for providing current to said fourth field-effect transistor when said second signal is in a second logic state.

2. The direct-coupled field-effect transistor logic latch circuit according to claim 1 wherein said shared load means includes:
    a sixth field-effect transistor having a drain coupled to a second supply voltage terminal, a gate, and a source coupled to said gate of said sixth field-effect transistor and to said drains of said first and fourth field-effect transistors.

3. The direct-coupled field-effect transistor logic latch circuit according to claim 2 wherein said load means includes:
    a seventh field-effect transistor having a drain coupled to said second supply voltage terminal, a gate, and a source coupled to said gate of said seventh field-effect transistor and to said drain of said third field-effect transistor.

4. A gallium-arsenide integrated field-effect transistor logic latch circuit, comprising:
    a first field-effect transistor having a drain, a gate coupled to a first input at which a first input signal is supplied, and a source;
    a second field-effect transistor having a drain coupled to the source of said first field-effect transistor, a gate coupled to a second input at which a second input signal is supplied, and a source coupled to a first supply voltage terminal;
    a third field-effect transistor having a drain coupled to an output of the latch circuit, a gate coupled to said drain of said first field-effect transistor, and a source coupled to said first supply voltage terminal;
    a fourth field-effect transistor having a drain coupled to said drain of said first field-effect transistor, a gate coupled to said output, and a source;
    a fifth field-effect transistor having a drain coupled to said source of said fourth field-effect transistor, a gate coupled to a third input to which the inversion of said second input signal is supplied, and a source coupled to said first supply voltage terminal;
    load means coupled to said drain of said third field-effect transistor for providing current thereto; and
    shared load means coupled to said drains of said first and fourth field-effect transistors for providing current to said first field-effect transistor when said second signal is in a first logic state and for providing current to said fourth field-effect transistor when said second signal is in a second logic state.

5. The field-effect transistor logic latch circuit according to claim 4 wherein said shared load means includes:
    a sixth field-effect transistor having a drain coupled to a second supply voltage terminal, a gate, and a source coupled to said gate of said sixth field-effect transistor and to said drains of said first and fourth field-effect transistors.

6. The field-effect transistor logic latch circuit according to claim 5 wherein said load means includes:
    a seventh field-effect transistor having a drain coupled to said second supply voltage terminal, a gate, and a source coupled to said gate of said seventh field-effect transistor and to said drain of said third field-effect transistor.

7. An improved gallium-arsenide direct-coupled field-effect transistor logic latch circuit having minimum power and device count and including an acquire stage for acquiring data when a clock is in a first logic state and a regeneration stage for maintaining the data when the clock is in a second logic state, wherein the improvement comprises:
    a transistor having first, second and control electrodes, said second electrode being coupled to a first supply voltage terminal, said first and control electrodes being coupled to both the acquire and regeneration stages, said transistor being shared to provide current to the acquire stage when the clock is in a first logic state and to provide current to the regeneration stage when the clock is in a second logic state.

* * * * *